United States Patent
Heine et al.

(10) Patent No.: US 6,500,546 B1
(45) Date of Patent: Dec. 31, 2002

(54) HALOGEN-FREE PHOSPHOROUS-CONTAINING FLAME-RESISTANT EPOXY RESIN COMPOSITIONS

(75) Inventors: Francoise Marie Louise Heine, Louvain-la-Neuve (BE); Jean Andre Alfred Riviere, Louvain-la-Neuve (BE); Philippe Eric Stevens, Louvain-la-Neuve (BE); Helga Leontina Andrea De Velder, Louvain-la-Neuve (BE)

(73) Assignee: Resolution Performance Products LLC, Houston, TX (US)

( * ) Notice: Subject to any disclaimer, the term of this patent is extended or adjusted under 35 U.S.C. 154(b) by 0 days.

(21) Appl. No.: 09/704,023

(22) Filed: Nov. 1, 2000

(30) Foreign Application Priority Data

May 2, 2000 (EP) .............................. 00201608

(51) Int. Cl.$^7$ .............................. B32B 15/08
(52) U.S. Cl. ................ 428/418; 428/901; 523/451; 525/327.4; 525/385
(58) Field of Search .................. 523/451; 428/418, 428/901; 525/327.4, 385

(56) References Cited

FOREIGN PATENT DOCUMENTS

JP          05222165       *   8/1993

OTHER PUBLICATIONS

CAS Reg. File printout, 2001.*

* cited by examiner

*Primary Examiner*—Robert Dawson
*Assistant Examiner*—D. Aylward

(57) ABSTRACT

Curable flame-resistant substantially halogen free epoxy resin compositions, comprising:
  (a) one or more bifunctional or polyfunctional epoxy resin;
  (b) a specific phosphorous-containing compound;
  (c) a curing agent consisting of oligomers of styrene and maleic acid and/or maleic anhydride and/or salts or esters of maleic acid;
  (d) a curing catalyst; and optionally;
  (e) additives;

prepregs derived from said compositions and laminates derived from said prepregs.

13 Claims, No Drawings

HALOGEN-FREE PHOSPHOROUS-CONTAINING FLAME-RESISTANT EPOXY RESIN COMPOSITIONS

1. FIELD OF THE INVENTION

The invention relates to halogen-free phosphorous-containing flame-retardant epoxy resin compositions, to prepregs derived by impregnation of porous webs, and to composites and in particular to laminates, derived from said prepregs and to be used in printed circuit boards.

2. BACKGROUND OF THE INVENTION

Composites based on epoxy resins and inorganic or organic reinforcing materials have become very important in many industrial fields and in everyday life. The reasons therefore are, on the one hand, the relatively simple and safe processing of epoxy resins and, on the other hand, the good mechanical and chemical properties of cured epoxy resin moulded materials, which allow adaptation to different applications and advantageous utilization of the properties of all the materials which are part of the composite.

Epoxy resins are advantageously processed into composites via preparation of prepregs. For this purpose inorganic or organic reinforcing materials or embedding components in the form of fibres, non-woven and woven fabrics, or of flat-shaped articles are impregnated with the resin. In most cases this is accomplished with a solution of the resin in an easy-to-evaporate or easy-to-volatilize solvent. The prepregs thus obtained after heating, must no longer be tacky, but must not yet be hardened after this process, but rather the resin matrix must be in a pre-polymerized state. In addition, the prepregs must have sufficiently long shelf life. Thus, for example, a shelf life of at least three months is required for circuit board manufacturing. When they are further processed into composites, the resin in the prepregs must also melt and flow on when the temperature is increased and must bond with the reinforcing materials or embedding components as well as with the materials provided for the composite as firmly and permanently as possible under pressure, i.e. the cross-linked epoxy resin matrix must have a high interfacial adhesion to the reinforcing materials, or embedding components, as well as to the materials to be bonded such as metals, ceramics, minerals, and organic materials.

In the cured state, composites are normally expected to have high mechanical strength and thermal stability, as well as chemical resistance, and heat distortion or resistance to ageing. For electrotechnical and electronic applications, the requirements also include permanently high electrical insulation capability and, for special applications, a plurality of other requirements. For use as circuit board material, for example, high dimensional stability over a broad temperature range, good adhesion to glass and copper, high surface resistivity, low dielectric loss factor, good machinability (punchability, drillability), low water absorption, and high corrosion resistance are required.

With increasing load and intensive use of the composites, in particular the requirement for heat distortion becomes especially important. This means that the materials must resist high temperatures without deformation or damage of the composite, for example by delamination, during processing and use. Circuit boards, for example, are exposed to temperatures of over 270° C. during flow soldering. Temperatures over 200° C. may also occur temporarily and in a limited area during cutting and drilling. Materials with a high glass transition temperature have advantageous characteristics in this respect. If the glass transition temperature is above the aforementioned values, dimensional stability in the temperature range prevailing during processing is generally ensured and damage such as warping and delamination are mostly avoided. The epoxy resin currently used worldwide for FR4 laminates has a glass transition temperature Tg of only 130° C. after curing. This results, however, in the above-mentioned type of damage and failure during manufacturing. Therefore, it is still desired to have comparatively easy-to-process and inexpensive materials with a glass transition temperature Tg of up to approximately 180° C., and more preferably in the range of from 140 to 180° C.

Another requirement that is becoming more and more important is that of flame resistance. In many areas this requirement has first priority due to possible hazards to people and property, for example, in construction materials for aircraft and automobile manufacturing, as wel as for vehicles in public transportation. Flame resistance of circuit board materials is essential in electrotechnical, but especially electronic, applications due to the high value of the electronic components mounted on the boards, and the risk of fire caused by a short circuit.

Therefore materials must pass one of the strictest tests and attain V-0 classification by UL 94 V, for evaluating their flammability. In this test, a test object is exposed to a well-defined flame positioned vertically under its lower edge. The sum of burning times in ten tests (5 samples, each sample of which is submitted to a standard flame twice) may not exceed 50 s. This requirement is difficult to meet, especially if the material is thin, as is the case in electronics. The epoxy resin industrially used worldwide for FR4 laminates only meets these requirements because it contains approximately 30% to 40% ring-brominated aromatic epoxy components, with reference to the resin, i.e. approximately 17%–21% bromine. For other applications, comparably high concentrations of halogen compounds are used, often also combined with antimony trioxide as a synergist. The problem with these compounds is that, while they are highly effective as fireproofing agents, they also have very objectionable properties. Thus, antimony trioxide is listed as a carcinogenic chemical, and aromatic bromine compounds, during thermal decomposition, not only split off bromine radicals and hydrogen bromide, which are highly corrosive, but, especially the highly brominated aromatic compounds may also form highly toxic polybromine benzofurans and polybromine benzodioxins upon decomposition in the presence of oxygen. The disposal of bromine-containing waste materials and toxic waste represents another problem.

Materials that partially or fully meet the heat distortion requirement include, for example, bismaleimide/triazine (BT)-based moulded materials with a Tg of approximately 200° C. or polyimide (PI) with a Tg of 260° C. to 270° C. Recently also BT/epoxy blends with a Tg of 180° C., as well as cyanate ester resins with a Tg>200° C., have also become available. Laminates manufactured with these resins systems exhibit, however, poorer processing and machining characteristics compared to epoxy resin-based laminates. Thus, for example, the production of PI-based laminates requires press temperatures of approximately 230° C. and considerably longer after-curing times (approx. 8 h) at temperatures of 230° C. Another disadvantage of these resin systems is their six to ten times higher material costs.

A comparatively expensive resin system is obtained if aromatic and/or heterocyclic polyepoxy resins, i.e. polyglycidyl compounds, are combined with aromatic polyamines acting as hardening agents. Such polyamines known, for example, from German Patent 2,743,680, result in network polymers that exhibit a particularly high heat distortion and resistance to ageing. European Patent No. 0,274,646B discloses that, using 1,3,5-tris(3-amino-4-alkylphenyl)-2,4,6-trioxohexahydrotriazines as hardening agents, laminates with a glass transition temperature of up to 245° C. and good processing and machining characteristics can be obtained.

Although the above-mentioned resin systems have a widely different flammability, they all share the disadvantage of being insufficiently flame-retardant. Therefore, in order to meet the requirement of passing the UL 94 V combustibility test via V-0 classification, which is essential for many applications, the use of highly effective bromine-containing fireproofing agents cannot be avoided. As a result, both the potential hazard associated with bromine compounds and the impaired thermal-mechanical characteristics caused by the bromine compounds must be taken into account.

For these reasons, extensive research has been conducted to replace bromine-containing fireproofing agents with less problematical substances. Thus, for example, fillers (with extinguishing gas effects such as aluminium oxide hydrates (see J. Fire and Flammability, Vol. 3 (1972), pp. 51 ff), basic aluminium carbonates (see Plast. Engng., Vol. 32 (1976), pp. 41 ff) and magnesium hydroxides (European application No. 0,243,201A), as well as vitrifying fillers such as borates (see Modern Plastics, Vol. 47(1970), No. 6, pp. 140 ff) and phosphates (U.S. Pat. Nos. 2,766,139 and 3,398,019) have been proposed. Most of these fillers have, however, the disadvantage of worsening, in some cases considerably, the mechanical, chemical, and electrical properties of the composites. In addition, they can leak out of the resin matrix during further processing of the printed circuit board and pollute therefore the processing solutions and cause non-homogeneous laminates. As said filler containing resin compositions tend to sedimentation and increase the viscosity of the filled resin system, they require more complicated processing methods.

The flame-retardant properties of red phosphorus has also been described (UK Patent No. 1,112,139), optionally in combination with finely dispersed silicon dioxide or aluminium oxide hydrate (U.S. Pat. No. 3,373,135). According to these documents, materials are obtained whose use in electrotechnical and electronic applications is limited due to the phosphoric acid produced in the presence of moisture and the associated corrosion. Moreover the formation of phosphines is expected when red phosphorus is contacted with moisture at higher temperatures. Organic phosphorus compounds, such as phosphoric acid esters, phosphonic acid esters and phosphines, have also been proposed as flame-retardant additives (see W. C. Kuryla and A. J. Papa Flame Retardance of Polymeric Materials, Vol. 1, Marcel Dekker Inc., New York, 1973, pp. 24–38 and 52–61). Since these compounds are known for their "softening" characteristics and are therefore extensively used worldwide as plasticizers for polymers (UK Patent No. 19,794), this alternative is therefore also not very promising.

In order to achieve flame-resistance according to UL 94 V-0, German Offenlegungsschrift 3,836,409 discloses a method for preparing prepregs by impregnating certain reinforcing materials or flat-shaped articles with a suspension of halogen-free, nitrogen- and phosphorus-containing fireproofing agents in a solution of aromatic, heterocyclic, and/or cycloaliphatic epoxy resins (in a non-ring-halogenated form or a ring-halogenated form with low halogen content) and aromatic polyamines and/or aliphatic amines acting as hardening agents. The fireproofing agents are halogen-free melamine resins or organic phosphoric acid esters, particularly melamine cyanurates, melamine phosphates, triphenyl phosphate and diphenylcresyl phosphate, as well as their mixtures. This, however, is also not a very promising solution, since the fillers used always increase water absorption and therefore prevent the material from passing the circuit board-specific tests.

Organic phosphorus compounds, such as epoxy group-containing phosphorus compounds, which can be anchored in the epoxy resin network, can also be used for providing epoxy resins with flame-retarding characteristics. Thus, European Patent No. 0,384,940B discloses epoxy resin mixtures containing a commercially available epoxy resin, the aromatic polyamine 1,3,5-tris(3-amino-4-alkylphenyl)-2,4,6-trioxo-hexahydrotriazine and an epoxy group-containing, glycidyl phosphate-, glycidyl phosphonate- or glycidyl phosphinate-based phosphorus compound. With such epoxy resin mixtures, flame-retardant laminates or composites that meet the V-0 classification requirements of UL 94 and have a glass transition temperature >200° C., can be obtained without adding halogens. Furthermore, these epoxy resin mixtures can be processed in a manner similar to that used for currently used epoxy resins.

Circuit boards constitute the basis for the production of electronic assemblies. They are used for connecting a variety of electronic and microelectronic components with one another to form electronic circuits. The components are connected to the circuit board by gluing or soldering using complex, highly automated assembly processes. Also in automatic insertion, there is a trend toward more streamlined manufacturing methods. Therefore IR reflow soldering, expected to replace other soldering processes in the future, is increasingly used in SMD technology. In this process, the entire circuit board is heated to temperatures >260° C., in a few seconds using IR radiation; this instantly evaporates any water absorbed in the circuit board. Only laminates with excellent interlaminar adhesion survive IR soldering processes without being destroyed by delamination. In order to reduce this hazard, expensive conditioning processes have been proposed (see Galvanotechnik, Vol. 84 (1993), pp. 3865–3870).

It is known that in laminates with high glass transition temperature, for example, based on PI- or BT-resins, the interlaminar adhesion is weaker than in the halogen-containing FR4 laminates that are being predominantly used today; this is also true for the laminates known from European Patent No. 0,384,940B. Most of the circuit boards manufactured today are multilayer (ML) circuit boards, which contain a plurality of structured conductor planes spaced and insulated from one another by epoxy resin compounds. The current trend in ML technology, however, is toward an increasing number of structured conductor planes; thus, currently multilayer circuit boards with more than 20 structured conductor planes are being manufactured. Since excessive overall thickness of these circuit boards must be avoided for technical reasons, the distance between the structured conductor planes is becoming increasingly smaller and thus interlaminar adhesion and copper adhesion in ML laminates with high glass transition temperature is becoming more and more problematic. In addition, this type of circuit board must have a high solder bath resistance in the case of IR soldering.

As stated earlier, it is known from European Patent No. 0,384,940B that laminates with a flame resistance meeting the requirements can be obtained without using halogens through phosphorus modification of impregnation resins. It was found, however, during production research, that phosphorus-modified laminates are subject to delamination during IR soldering. Therefore, urgent need has arisen for electrolaminates having the required flame resistance without the use of halogens, for example through incorporating phosphorus into the resin matrix, but which are also suitable for IR soldering required for SMD technology. This requires electrolaminates with extremely high solder bath resistance. In circuit board technology, the high-pressure cooker test (HPCT) and the determination of solder bath resistance are primarily used to test the suitability of laminates for high thermal stressing. In HPCT, a laminate specimen (5×5 cm or 10×10 cm), freed of copper, is exposed to 120° C. and approximately 1 bar steam pressure for 30 minutes and then dipped for 20 seconds in a solder bath at 260° C.

The aspect of the laminates is then evaluated according to a scale going from 1 to 5 (1 being the worse case), depending on the presence of blisters, measles or delamination. The test is described in IPC-TM-650 (test 2.6.16).

More recent efforts aiming at compositions for the manufacture of prepregs, the laminates of which can meet all the hereinbefore depicted requirements, can be derived from e.g. WO99/00451; WO98/13407; U.S. Pat. Nos. 5,756,638; 5,759,690; 5,817,736; 5,760,146; 5,648,171; Japanese Kokai Hei 11-124.489 and Japanese Kokai Hei 11-158.251, commonly proposing the use of resin systems, which comprise one or more expensive constituents.

Recently proposed epoxy resin compositions, comprising a copolymer of styrene and maleic anhydride as curing agent, are known from e.g. EP 0,779,902A (WO96/07683), WO98/31750, WO98/18845, WO97/48752, and JP-Hei-9-194610.

However, said compositions did not contain any phosphorous compound to reach flame-resistant derivatives from them.

The disclosed flame-resistant compositions, to be used for the manufacture of laminates and printed wiring boards, either comprised brominated bisphenol structures or they comprised an additional allyl network forming compound, such as triallyl cyanurate.

It will be appreciated that there is still a need for less expensive resin systems for the manufacture of prepregs and electric laminates thereof, which are halogen free and which meet the depicted electronic industry requirements.

Therefor an object of the present invention is to provide relatively less expensive resin systems, which can provide laminates for electric printed circuit boards, meeting the modern industry requirements according to FR-4 and CEM-3 as well.

As a result of extensive research and experimentation said compositions and prepregs and laminates aimed at have surprisingly been found.

3. SUMMARY OF THE INVENTION

Accordingly the invention relates to curable flame-resistant substantially halogen free epoxy resin compositions, comprising:

(a) one or more bifunctional or polyfunctional epoxy resin;

(b) a phosphorous-containing compound selected from the group consisting of:

b,1

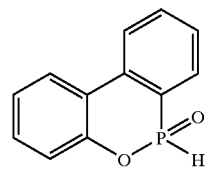

b,2 at least one compound selected from the group selected from (2)

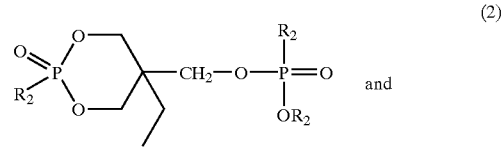

and (3)

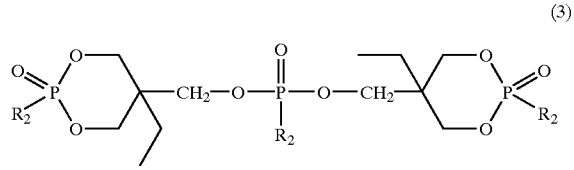

and mixtures thereof, wherein $R_2$ represents an alkyl group having from 1 to 4 carbon atoms, and preferably 1 carbon atom, and b,3

(4)

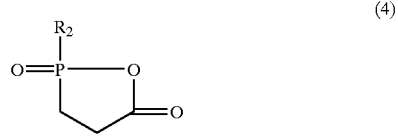

and combinations of b1, b2 and b3, or b1 and b2, or b2 and b3 or b1 and b3;

(c) a curing agent consisting of oligomers of styrene and maleic acid and/or maleic anhydride and/or salts or esters of maleic acid of the formulae:

(5)

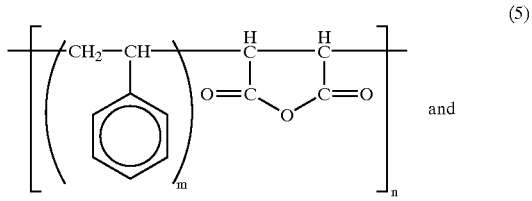

and (6)

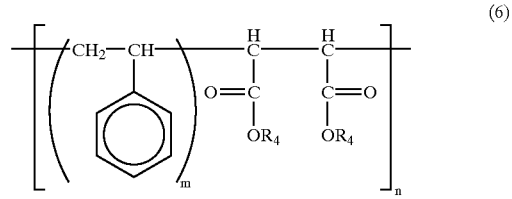

wherein m is an integer in the range of from 1–6, wherein n is an integer in the range of from 2–12, wherein each of $R_4$ may have the same or different meaning and may represent H, or a salt forming residue and in particular alkali metal, alkaline earth metal or ammonium, or an ester group such as a lower alkyl group of from 1 to 5 carbon atoms, or benzyl or alkylsubstituted benzyl, optionally (d) a curing catalyst, and optionally (e) additives.

4. DETAILED DESCRIPTION OF THE INVENTION

With the term "substantially halogen free" as used throughout the specification is meant that no halogen containing components are included in the compositions of the present invention.

In particular no halogen containing (chlorine or bromine containing) epoxy resins are included.

Preferred components (c) are those of formulae (5) and (6) wherein m=2–4 and n=6–8.

Preferred components (c) of formula 6 are those wherein $R_4$ is H and sodium. More preferred components (c) are those of formula (5) wherein m=2–4 and n=6–8.

In the hereinbefore specified compositions the component (a) may be selected from a great variety of epoxy resins, having at least two epoxy groups per molecule.

Preferred examples of said epoxy resins are the diglycidyl ethers derived from bisphenol A, such EPIKOTE resin 828 (EPIKOTE is a trade mark) of Shell Chemicals Comp., or derived from bisphenol F (EPON 862), or advanced resins derived from said basic resin and bisphenol A (YX 4000), or a polyfunctional epoxy resin of the ortho cresol novolak type such as EPON 164 epoxy resin, or a phenol novolak type such as EPON 154 resin, or a DPP novolak resin (such as EPON 180) (EPON is a trade mark).

More preferably a polyfunctional epoxy resin derived from ortho cresol novolak or from phenol novolak is applied or mixtures thereof with diglycidyl ethers of bisphenol A. Most preferred are polyfunctional epoxy resins derived from ortho cresol novolak.

As component (b) phosphorous containing compounds can be used of the formulae (1)–(4), providing a phosphorous content in the complete compositions of from 3 to 4.5 wt % and preferably from 3.5 to 4 wt %.

Preferably commercial phosphorous compounds, available under the tradenames HIRETAR (trade mark) or STRUKTOL POLYDIS (trade mark) or EXOLIT (trade mark) are applied, such as HIRETAR 101, EXOLIT OP910, and wherein all groups $R_2$ represent a $CH_3$ group.

As component (c) one or more oligomers of the formulae (5) or (6) can be used, such as those marketed by Elf Atochem under the trade mark ATO.

Examples of said components are ATO SMA 1000, 1440, 2000, 2625, 3000, 3840, EF30, EF40 and/or SMA 1440 H, 1440 HDN, 2625 H, 17352 HD, 1000 H/H Na, 2000 H/H Na, 3000 H/H Na.

More preferred components (c) are ATO SMA 1000, 2000, 3000, EF30 or EF40 and most preferred are EF30 and EF40.

As curing catalyst (d) can be used a variety of conventional catalysts such as substituted imidazoles. Preferred catalysts are 2-alkyl imidazoles and more preferred is 2-methyl imidazole.

As additive component (e) can be inter alia used, if any, a great variety of usual additives, known to be used in epoxy resin compositions. They can inter alia be selected from red phosphorous in powder form, the surface of which has been pretreated, aluminium hydroxide, aluminium oxides, ammonium polyphosphate, melamine cyanurate, zinc borate, magnesium hydroxide, magnesium carbonate, calcium carbonate, methyl ethyl phosphinic acid, ethyl phosphonic acid.

More preferred complete compositions of the invention ready for the manufacture of prepregs are those comprising:

(a) a diglycidyl ether of bisphenol A or a residue of an advanced resin, derived from said basic resin (e.g. EPIKOTE 828 epoxy resin) and bisphenol A; and/or a polyfunctional epoxy resin of the ortho-cresol novolak type, such as EPON 164 epoxy resin (Shell Chemicals Comp.);

(b) a phosphorous containing a compound of formula (1), such as HIRETAR 101 (HIRETAR is a trade mark of Schill und Seilacher), and a phosphorous-containing compound of formula (2), wherein $R_2=CH_3$ (e.g. EXOLIT OP 910) (EXOLIT is a trade mark of Clariant);

(c) a styrene maleic anhydride oligomer of formula (5), wherein m=3–4 and n=6–8, in methylethylketone as solvent (from 50 to 70 wt % solution) and wherein the phosporous content is in the range of from 3.5 to 4.5 wt %, relative to the weight of the total composition; and (d) 2-methylimidazole as curing catalyst.

Said preferred compositions have been used for the impregnation of porous webs of glass, or aramide fibres and most preferably glass cloth, which has optionally been pretreated.

It will be appreciated that the complete compositions of the invention ready for the manufacture of prepregs (varnish) have appeared to provide a very attractive combination of properties, i.e. a combination of halogen-free ingredients, a well-controlled reactivity of the varnish, a high Tg of the cured varnish between 140° C. to 180° C., excellent heat resistance (TGA), low water absorption and low dielectric constant while the UL 94 V-0 could be reached with relatively low phosphorous content in the total composition (from 3.5 to 4 wt %).

Preferably the mutual weight ratios of the components (a), (b), (c), (d) and (e) are in the range of from 10–50 wt %; 10–30 wt %; 30–70 wt %; 0–0.2 wt %; 0–40 wt %; and more preferably from 20–40 wt %; 15–25 wt %; 40–60 wt %; 0–0.1 wt % 0–5 wt %, the sum of the component amounts being 100%.

It will be appreciated by a person skilled in the art that the ingredients (a), (b), (c) and optionally (e) are preferably used in the form of a premix in a suitable polar solvent, such as alcohols, esters or ketones and preferably ketones, such as methyl ethyl ketone or methyl proxitol.

Component (d) can be added as such or as a solution in the same or similar solvent.

Another aspect of the present invention is formed by the prepregs and laminates derived from the complete varnish compositions and chopped glass fibres, glass matt, or porous, non-woven or woven webs of glass fibre, aramide fibre (e.g. TWARON) (TWARON is a trade mark) or THERMANT (tradename) or polypropylene fibres.

The invention is further illustrated by the following examples, however, without restricting its scope to these embodiments.

EXAMPLES

Example 1

A resin system was prepared by mixing the following ingredients at room temperature into methyl ethylketone in order to get a 60 wt % solution:

EPON 164 epoxy resin (derived from ortho cresol novolak (39 wt % relative to the weight of all dissolved components);

EXOLIT OP910 (10 wt %, a phosphor compound according to formula (2), wherein $R_2=CH_3$ of CLARIANT);

HIRETAR 101 powder (6 wt %, a phosphor compound according to formula (1) of Schill und Seilacher);

ATO SMA EF30 (45 wt %, a compound according to formula (5) of Elf Atochem); and 2-methylimidazole in a 10 wt % solution in methyl proxitol was mixed in about 30 minutes with the obtained solution up to a total concentration of 0.04 wt % relative to the weight of non-solvent ingredients, before impregnation.

A standard glass cloth (7628 style, 200 g/m², epoxy silane finished) of 20 cm×20 cm, was impregnated with the resin solution by hand.

The impregnated fabric was cured in a forced air circulated oven at 170° C. to reach the B-stage (prepreg). The laminates were then prepared by placing 7 prepreg layers in a Bucher-KHL 100 press. The temperature of the plates was fixed at 170° C. for 1 hour and 200° C. for another hour. The applied force was of 0.04 KN/cm² multiplied by the area of the laminate during heating (7–8° C./min) to 170° C. and 0.4 KN/cm² multiplied by the area of the laminate the rest of the time (2 hours). The laminates were finally cooled down to room temperature, still under high pressure. The cured laminates were cut with a diamond saw, in order to make samples for the various tests, and conditioned in the oven for 1 hour at 100–105° C. They were then stored in a dessicator (containing silica gel) before testing.

Testing

The reactivity of the uncured systems was measured by the Gel Time technique on a hot plate at 170° C. A low Hot Plate Gel Time (HPGT) corresponds to a high reactivity (measured value is 195 seconds).

The glass transition temperature (Tg) of the cured products was measured to be in the range of 160 to 168° C. using a Differential Scanning Calorimeter (DSC) at a heating rate of 20° C./minute (second run is taken into account).

The vertical burning test of classifying materials as UL94 was carried out according to the "Standard for Flammability Tests of Plastic Materials in Devices and Appliances" issued by the Underwriters Laboratories Inc.

The laminate is UL 94 V-0. The water absorption was measured according to the standard test method IPC-TM-650 2.6.2.1 (IPC=The Institute for Interconnecting and Packaging Electronic Circuits).

The Pressure Cooker Test was carried out according to the standard test method IPC-TM-650 2.6.16. A value of 5 corresponds to no measles, no blisters or surface erosion. A value of 1 indicates large blisters, delamination or convolution.

Thermogravimetry (TGA) heat resistance results were measured on cured prepregs (same cure cycle as for the laminates), using a Perkin Elmer 7 Series Thermal Analysis System. Weight losses were measured during a fast heating with a speed of 100° C./minute until 260° C. and maintaining this temperature during 60 minutes.

Similar examples were prepared, the operational conditions and results of which have been listed in the following table.

TABLE

| FORMULATION | A | B | C | D | E | F | G | H | I |
|---|---|---|---|---|---|---|---|---|---|
| | MEK | MEK | MeProx | MEK | MEK | MEK | MEK | MEK | MEK |
| E 164 | 18 | 0 | 16.9 | 16.3 | 16.15 | 16.5 | 18.4 | 17.9 | 16.2 |
| E 828 | 18 | 0 | 16.9 | 16.3 | 16.15 | 16.5 | 18.4 | 17.9 | 16.1 |
| E 154 | 0 | 36 | 0 | 0 | 0 | 0 | 0 | 0 | 0 |
| OP910 | 12 | 13.5 | 12.9 | 15 | 14 | 13 | 11.2 | 12.5 | 12.9 |
| HIRETAR | 8 | 8.5 | 6.4 | 7.5 | 9.3 | 7 | 8.7 | 9.6 | 6.4 |
| ATO SMA EF30 | 44 | 42 | 46.9 | 44.9 | 44.4 | 47 | 43.3 | 42.1 | 48.4 |
| 2-MI | 0.04 | 0.04 | 0.04 | 0.04 | 0.04 | 0.04 | 0.04 | 0.04 | 0.04 |
| P-level, % | 3.6 | 4 | 3.6 | 4.2 | 4.2 | 3.7 | 3.6 | 4 | 3.6 |
| PROPERTIES | | | | | | | | | |
| Varnish | | | | | | | | | |
| HPGT, s | 198 | 153 | 172 | 195 | 215 | 205 | 202 | 208 | 206 |
| Laminate | | | | | | | | | |
| Tg, ° C. | 149 | 148 | 150 | 145 | 149 | 148 | 148 | 150 | 156 |
| PCT | 5 | na | 5 | 4 | 5 | 4 | 5 | 5 | 5 |
| Water abs., % | 0.2 | na | 0.2 | 0.2 | 0.2 | 0.2 | 0.2 | 0.2 | 0.2 |
| UL-94 | V-0 | V-0 | V-0 | V-0 | V-0 | V-0 | V-0 | V-0 | V-0 |
| Average BT, s | 8.8 | 4.4 | 5.3 | 5.8 | 4 | 9 | 2.4 | 3 | 4.4 |
| TGA | — | — | — | — | — | — | — | — | — |

Remarks na=non-available.
Resin Content of the various laminates was between 35 and 50%.
MEK means that MEK is the only solvent used.
MeProx means that some MethylProxitol was used in combination with MEK, in order to improve the wetting.
Components in Formulation E 164 stands for EPIKOTE 164, epoxy ortho cresol novolac from Shell Chemicals.
E 154 stands for EPIKOTE 154, epoxy phenol novolac from Shell Chemicals.
E 828 stands for EPIKOTE 828 LVEL, Bisphenol-A epoxy resin from Shell Chemicals.
OP 910 stands for EXOLIT OP 910 supplied by CLARIANT.
HIRETAR stands for Hiretar 101 supplied by Nordmann, Rasmann GmbH & Co.
EF30 stands for SMA EF 30 supplied by ELF ATOCHEM.
2-MI stands for 2-Methyl Imidazole supplied by ALLDRICH.

What we claim is:

1. Curable flame-resistant substantially halogen free epoxy resin compositions, comprising:

(a) one or more bifunctional or polyfunctional epoxy resin;

(b) a phosphorous-containing compound selected from the group consisting of:

b,1

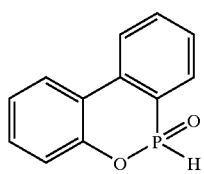
(1)

b,2 at least one compound selected from the group selected from

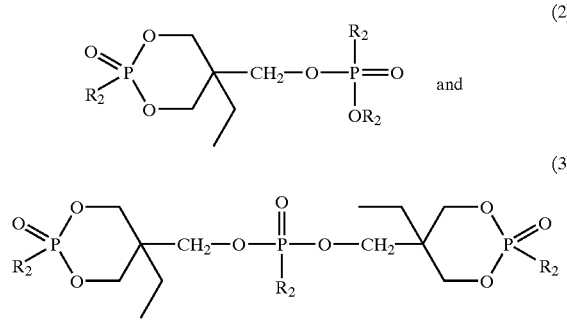
(2)

and (3)

and mixtures thereof, wherein $R_2$ represents an alkyl group having from 1 to 4 carbon atoms, and b,3

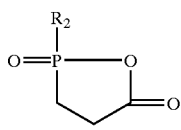
(4)

and combinations of b1, b2 and b3, or b1 and b2, or b2 and b3 or b1 and b3;

(c) a curing agent comprising oligomers of styrene and maleic acid and/or maleic anhydride and/or salts or esters of maleic acid of the formulae:

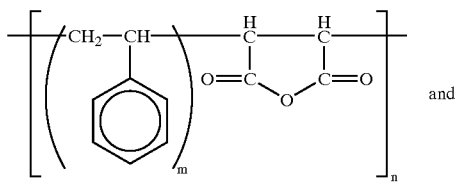
(5)

and

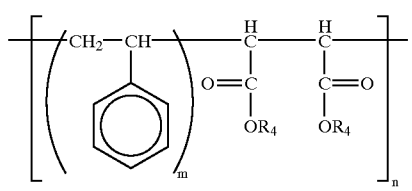
(6)

wherein m is an integer in the range of from 1–6, wherein n is an integer in the range of from 2–12, wherein each of $R_4$ independently represents hydrogen, an alkali metal, alkaline earth metal or ammonium, an ester group, or benzyl or alkylsubstituted benzyl, and (d) a curing catalyst.

2. Curable flame-resistant substantially halogen free epoxy resin compositions according to claim 1, wherein $R_2$ is an alkyl group having 1 carbon atom, and said ester group contains from 1 to 5 carbon atoms.

3. Curable flame-resistant substantially halogen free epoxy resin compositions according to claim 1, characterized in that component (c) is a compound of formulae 5 or 6 wherein m=2–4 and n=6–8.

4. Curable flame-resistant epoxy resin compositions according to claim 3, characterized in that component (c) is formed by a compound of formula (5).

5. Curable flame-resistant epoxy resin compositions according to claim 1, characterized in that the composition has a phosphorous content of 3 to 4.5 wt %, relative to the weight of the complete composition.

6. Curable flame-resistant epoxy resin compositions, according to claim 1, wherein the cure catalyst comprises 2-methyl imidazole.

7. Curable flame-resistant epoxy resin compositions, according to claim 1, comprising a polyfunctional epoxy resin derived from ortho cresol novolak.

8. Curable flame-resistant epoxy resin compositions, according to claim 1, wherein component (b) comprises phosphorous containing compounds of formulae 1 and 2, wherein $R_2=CH_3$.

9. Curable flame-resistant epoxy resin compositions according to claim 1, characterized in that the mutual weight ratios of components (a), (b), (c), (d), and (e) are in the range of from 10–50 wt %; 10–30 wt %; 30–70 wt %; 0–0.2 wt %; 0–5 wt %, the sum of the component amounts being 100%.

10. Curable flame resistant epoxy resin compositions according to claim 9, characterized in that the mutual weight ratios of components (a), (b), (c), (d) and (e) are in the range from 20–40 wt %; 15–25 wt %; 40–60 wt %; 0–0.1 wt %; 0–5 wt %.

11. Prepregs derived from curable flame resistant substantially halogen free epoxy resin compositions according to claim 1, by impregnation of chopped glass fibres, glass matt or porous non-woven or woven webs of glass fibre or aramide fibres or polypropylene fibres.

12. Laminates derived from prepregs according to claim 11.

13. Printed circuit boards for electronic or electric equipment, derived from prepregs according to claim 11.

* * * * *